(12) United States Patent
Kashiwagi et al.

(10) Patent No.: US 8,419,950 B2
(45) Date of Patent: Apr. 16, 2013

(54) PATTERN FORMING METHOD

(75) Inventors: Hiroyuki Kashiwagi, Fujisawa (JP); Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 214 days.

(21) Appl. No.: 12/884,617

(22) Filed: Sep. 17, 2010

(65) Prior Publication Data

US 2011/0068081 A1    Mar. 24, 2011

(30) Foreign Application Priority Data

Sep. 24, 2009  (JP) .................................. 2009-219689

(51) Int. Cl.
*B44C 1/22*    (2006.01)

(52) U.S. Cl.
USPC ................... 216/12; 216/11; 216/41; 216/49; 430/312

(58) Field of Classification Search .............. 216/41, 216/43, 44, 47, 48, 11, 12, 49, 66; 430/311, 430/313, 312
See application file for complete search history.

(56) References Cited

U.S. PATENT DOCUMENTS

| | | | |
|---|---|---|---|
| 7,675,084 B2 * | 3/2010 | Wierer et al. | 257/98 |
| 2003/0129545 A1 * | 7/2003 | Kik et al. | 430/313 |
| 2006/0273245 A1 * | 12/2006 | Kim et al. | 250/226 |
| 2010/0308513 A1 | 12/2010 | Kashiwagi et al. | |

FOREIGN PATENT DOCUMENTS

| | | |
|---|---|---|
| JP | 2006-287012 | 10/2006 |
| JP | 2009-10188 | 1/2009 |
| JP | 2009-87519 | 4/2009 |
| JP | 2009-192259 | 8/2009 |
| JP | 2009-201406 | 9/2009 |
| WO | WO 2009/110222 A1 | 9/2009 |
| WO | WO 2009/110595 A1 | 9/2009 |

OTHER PUBLICATIONS

Notice of Reasons for Rejection from the Japanese Patent Office for JP 2009-219689, mailed Nov. 15, 2011.
International Preliminary Report on Patentability including Written Opinion issued by the International Bureau of WIPO on Oct. 7, 2010, for International Patent Application No. PCT/JP2009/054226.

* cited by examiner

*Primary Examiner* — Lan Vinh
(74) *Attorney, Agent, or Firm* — Finnegan, Henderson, Farabow, Garrett & Dunner, LLP

(57) ABSTRACT

According to one embodiment, a pattern forming method is disclosed. The method includes contacting a template with light curable resin on a substrate. The template comprises a concave-convex pattern including concave portions and convex portions, and a metal layer provided on a convex portion of the concave-convex pattern. The concave-convex pattern is to be contacted with the light curable resin. The pattern forming method further includes irradiating the light curable resin with light of a predetermined wavelength under a condition $\epsilon_1 = -2\epsilon_2$. Where $\epsilon_1$ is a complex relative permittivity of the metal layer corresponding to the predetermined wavelength, $\epsilon_2$ is a complex relative permittivity of the light curable resin corresponding to the predetermined wavelength.

10 Claims, 6 Drawing Sheets

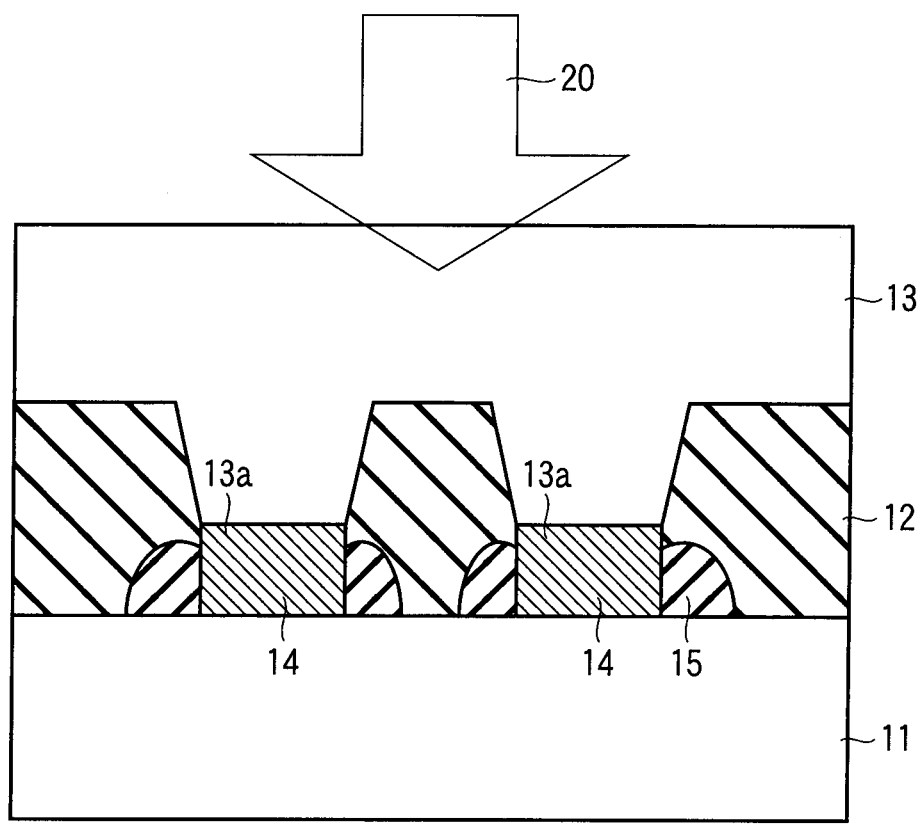
F I G. 1

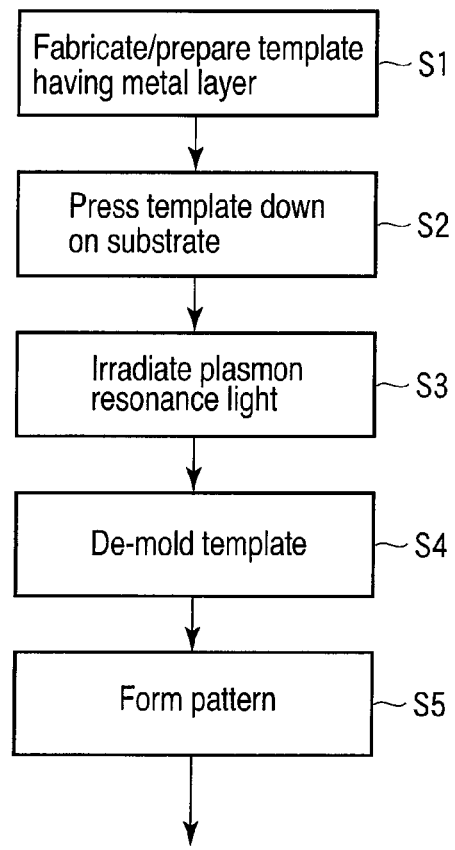
F I G. 2
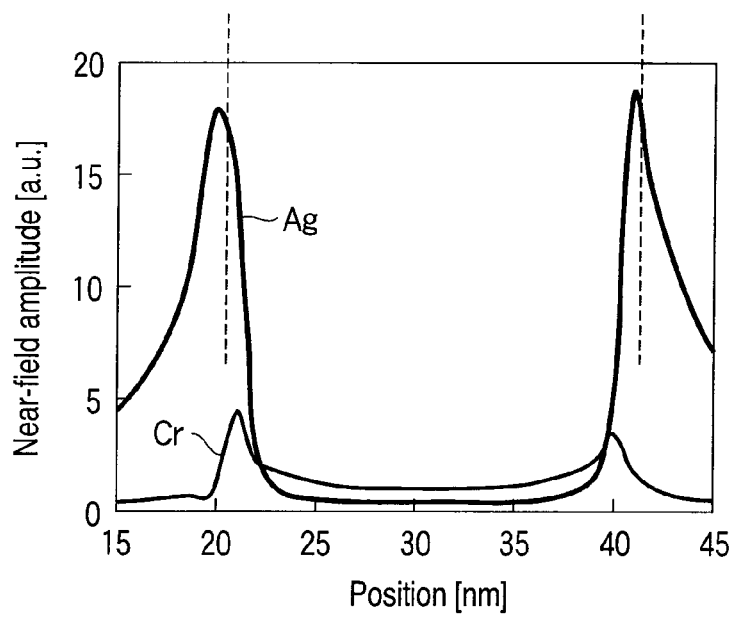
F I G. 3

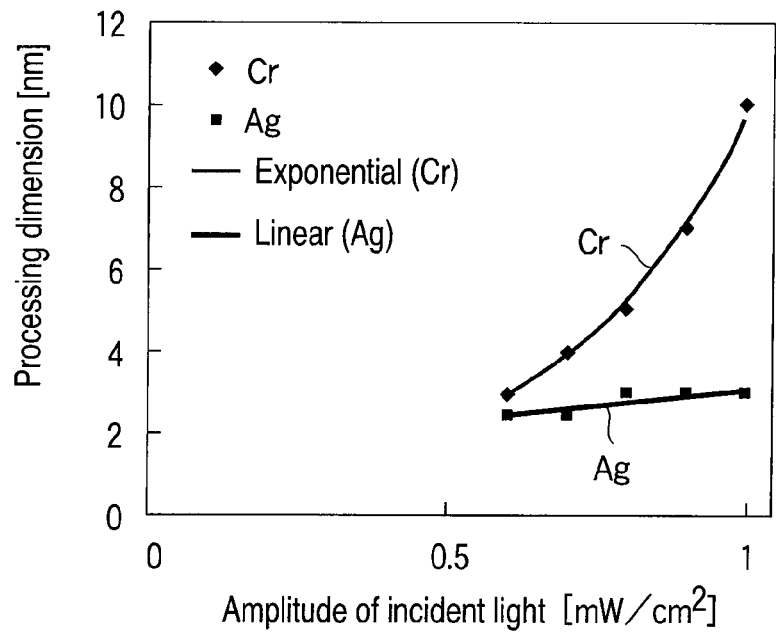
F I G. 4
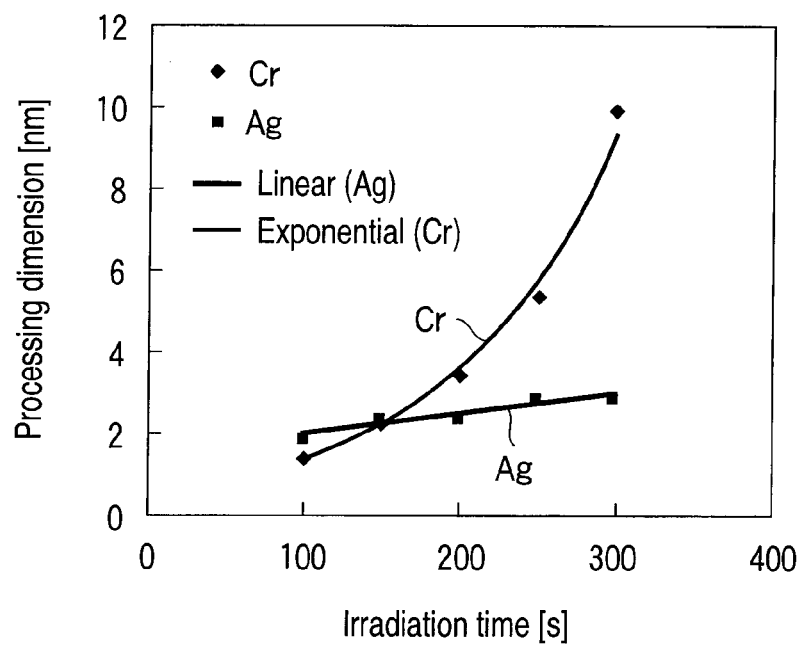
F I G. 5

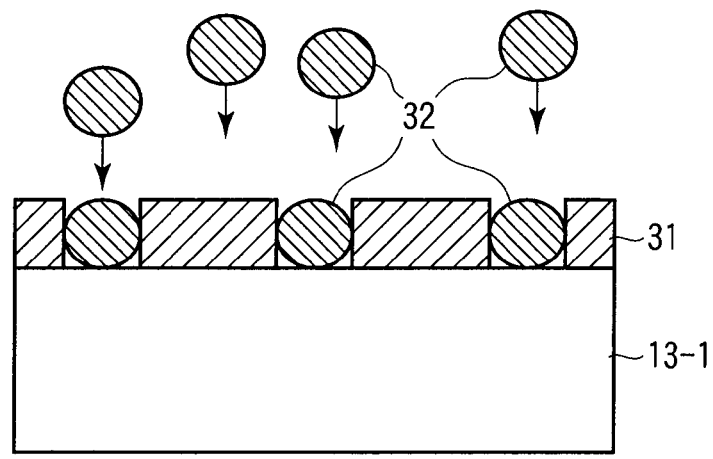
F I G. 10
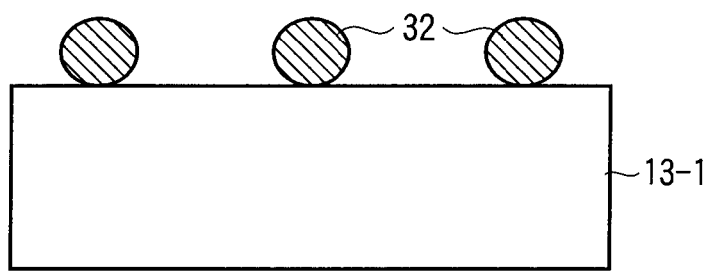
F I G. 11
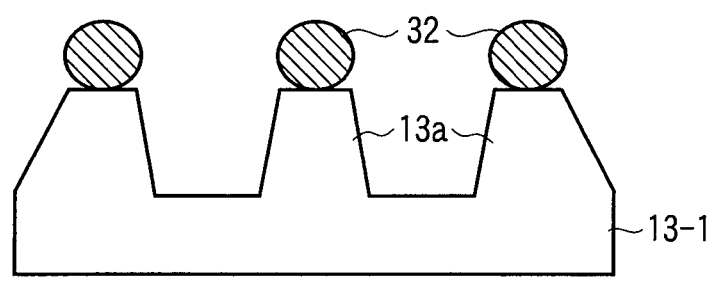
F I G. 12

PATTERN FORMING METHOD

CROSS-REFERENCE TO RELATED APPLICATIONS

This application is based upon and claims the benefit of priority from Japanese Patent Application No. 2009-219689, filed Sep. 24, 2009; the entire contents of which are incorporated herein by reference.

FIELD

Embodiments described herein relate generally to a pattern forming method applicable to forming a fine pattern.

BACKGROUND

A fine processing technology of a semiconductor device acceleratively progresses. In a semiconductor device, a fine pattern is formed by using a photolithography technique. However, as can be seen from the following equation (1), a diffraction limit exists in the resolution HP of photolithography in accordance with a wavelength. For this reason, the resolution HP of photolithography has a limit.

$$HP = k1 \cdot \lambda / (NA) \quad (1)$$

where, $\lambda$ is an exposure wavelength, k1 is a process factor (k1 factor: constant), and NA is a numerical aperture of a projection lens.

When photolithography is applied in order to form an nm-order fine pattern, there is a need to use shorter a wavelength such as ultraviolet rays or an X-ray. However, a light source is expensive, then the foregoing photolithography is not adaptable to mass production. Considering the foregoing circumstances, a relatively low-cost fine pattern forming method, which does not depend on the wavelength, such as near-field lithography or near-filed assist nano-imprint has been developed (e.g., see Jpn. Pat. Appln. KOKAI Publication No. 2006-287012).

According to the near-filed assist nano-imprint technique using metal disclosed in Publication No. 2006-287012, a pattern is formed by near-filed having amplitude distribution generated around the metal, but due to an error of light irradiation time or non-uniformity of light amplitude, a dimension error arises in the pattern. This results from the factor that the near-field amplitude distribution changes exponentially from the surface.

BRIEF DESCRIPTION OF THE DRAWINGS

FIG. 1 is a cross-sectional view to explain a pattern forming method in accordance with one embodiment;

FIG. 2 is a flowchart to explain a pattern forming method in accordance with one embodiment;

FIG. 3 is a graph showing light amplitude distribution with respect to different metals;

FIG. 4 is a graph showing relationship between amplitude of incident light and processing dimension in cases of using plasmon resonance and not using plasmon resonance;

FIG. 5 is a graph showing the relationship between irradiation time and processing dimension in cases of using plasmon resonance and not using plasmon resonance;

FIG. 10 is a cross-sectional view showing an example of fabrication process of another template in accordance with one embodiment;

FIG. 11 is a cross-sectional view showing the fabrication process following FIG. 10;

FIG. 12 is a cross-sectional view showing the fabrication process following FIG. 11.

DETAILED DESCRIPTION

Figure 6:
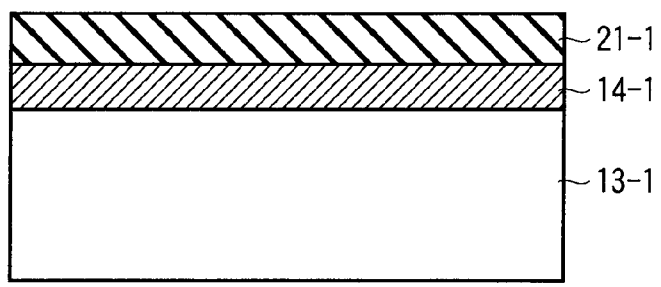
FIG. 6 is a cross-sectional view showing an example of fabrication process of template in accordance with one embodiment.

Embodiments will be described below with reference to the accompanying drawings.

First Embodiment

In general, according to one embodiment, a pattern forming method includes contacting a template with light curable resin on a substrate. The template includes a concave-convex pattern including concave portions and convex portions, and a metal layer provided on a convex portion of the concave-convex pattern. The concave-convex pattern is to be contacted with the light curable resin. The pattern forming method further includes irradiating the light curable resin with light of a predetermined wavelength under a condition $\epsilon_1 = -2\epsilon_2$. Where $\epsilon_1$ is a complex relative permittivity of the metal layer corresponding to the predetermined wavelength, $\epsilon_2$ is a complex relative permittivity of the light curable resin corresponding to the predetermined wavelength.

Second Embodiment

This second embodiment relates to a method for forming a pattern having an accurate dimension by imprint process using plasmon resonance. The plasmon resonance denotes that near-field light amplitude of medium around the specific metal is enhanced when the specific metal is irradiated with light having the specific wavelength.

For example, in case of minute spherical metal, a localized plasmon resonance is excited around the minute spherical metal, when a complex dielectric constant $\epsilon_1 (\lambda)$ of metal corresponding to wavelength $\lambda$ of incident light and a complex dielectric constant $\epsilon_2 (\lambda)$ of dielectric material corresponding to the wavelength $\lambda$ of the incident light satisfies following formula (2).

$$\epsilon_1 = -2\epsilon_2 \quad (2)$$

It is noted that the light to be irradiated on the metal (irradiation light) must have plane polarization (P polarization) since the surface plasmon is transverse magnetic (TM) polarized wave. The irradiation light is rendered to have plane polarization (P polarization) by using polarizer for instance.

Under the forgoing condition, by disposing a metal layer on a part of template, electric filed in the vicinity of the metal layer can be considerably increased.

FIG. 1 and FIG. 2 show a fine pattern forming method using plasmon resonance in accordance with the present embodiment. More specifically, FIG. 1 is a cross-sectional view showing the fine pattern forming method. FIG. 2 is a flowchart to explain the fine pattern forming method.

First, a template 13 is fabricated or prepared (S1). The template 13 comprises a concave-convex pattern formed of translucent material and a metal layer 14 provided on concave portions 13a of the concave-convex pattern. The method for fabricating the template 13 will be explained later. The metal layer 14 is, for example, formed of Ag (silver) or Al (aluminum).

The template 13 having the structure is pressed down on light curable resin 12 applied on a substrate 11 to be processed (S2). The concave portions 13a and metal layer 14 are positioned in the light curable resin 12. A tip portion of the metal layer 14 is abutted against the surface of the substrate 11.

Under this state, the light 20 satisfying the condition that generates plasmon resonance (plasmon resonance light) is irradiated from a surface opposite to the surface where the concave portions 13a of the template 13 is formed (S3). That is, the light 20 is irradiated onto the metal layer 14 and the light curable resin 12 via the template 13 under the condition that plasmon resonance is generated. The wavelength of the light 20 is, for example, in a range of 365 nm-450 nm, which causes plasmon resonance of Ag constituting the metal layer 14.

Here, the complex dielectric constants of the metal layer 14 and the light curable resin 12 satisfy the relationship of the formula (2). Moreover, the plasmon resonance light is a plane polarized light whose main component is an electric vector oscillating in a vertical direction to the concavo-convex pattern. Therefore, the plasmon resonance serves to increase the near-field light amplitude of the metal layer (Ag) 14. In FIG. 1, a reference number 15 denotes a near-field region.

The light curable resin 12 is effectively cured by light 20 when the near-field light amplitude is increased by using plasmon resonance as mentioned above. After the light curable resin 12 is cured (solidified), the template 13 is separated from the light curable resin 12 (template de-molding) (S4). Thereafter, the fine pattern is formed through a process including etching the substrate 11 by using the light curable resin cured by light irradiation as a mask (S5).

Here if the uppermost layer of the substrate 11 is a conductive film such as a polysilicon film or a metal film, a fine electrode pattern or a fine interconnection pattern is formed.

Moreover, if the uppermost layer of the substrate 11 is an insulating film such as a silicon oxide film or a silicon nitride film, a fine contact hole pattern or a fine gate insulating film is formed.

Moreover, if the substrate 11 is a semiconductor substrate such as a silicon substrate, a fine isolation trench (STI) is formed.

FIG. 3 is a graph showing a light amplitude distribution (near-field amplitude) in the vicinity of template comprising Ag and Cr (chromium) when a light wavelength ranges from 365 nm to 450 nm.

That is, as illustrated in FIG. 1, the template 13 comprises rectangular concave portions 13a with 20 nm half pitch and rectangular metal layers 14 with 20 nm×20 nm×20 nm size on the concave portions 13a. A sample in which the metal layers 14 are formed of Ag, and another sample in which the metal layers 14 are formed of Cr, are irradiated with light having a wavelength ranging from 365 nm to 450 nm, and the light amplitude distribution in the vicinity of the templates are measured. The rectangular metal layer 14 is equivalent to a 20 nm sphere, and the localized plasmon resonance is excited.

In the graph of FIG. 3, the horizontal axis takes a position, and the vertical axis takes a light amplitude. When Ag capable of arising plasmon resonance is used, it can be seen that the light amplitude in the vicinity of the template is ten times or more as much as the amplitude of the incident light. In contrast, when Cr capable of arising no plasmon resonance is used (in case of plasmon non-resonance), the light amplitude in the vicinity of the template is five times or less as much as the amplitude of the incident light.

FIG. 4 is a graph showing relationship between amplitude of incident light and processing dimension in cases of using plasmon resonance and not using plasmon resonance.

As seen from FIG. 4, when Cr is used, that is, when the pattern is formed without using plasmon resonance, the dimensional error of the formed pattern is 7 nm to the maximum.

In contrast to the foregoing case, when Ag is used, that is, when the pattern is formed using plasmon resonance, the dimensional error of the formed pattern is 1 nm or less to the maximum.

Therefore, in a case of pattern fabrication using plasmon resonance, the dimensional error cab be reduced even if the amplitude of the incident light varies. That is, the method for forming the pattern with accurate dimension by imprint is realized.

FIG. 5 is a graph showing the relationship between irradiation time and processing dimension in cases of using plasmon resonance and not using plasmon resonance.

As seen from FIG. 5, when Cr is used, that is, when the pattern is formed without using plasmon resonance, the dimensional error of the formed pattern is 8 nm or more.

In contrast, when Ag is used, that is, when the pattern is formed with using plasmon resonance, the dimensional error of the formed pattern is within 1 nm.

As described above, when the pattern is formed with using plasmon resonance, the dimensional error of the formed pattern, which is caused by the error of the amplitude of incident light or the error of the irradiation time, can be suppressed. That is, a pattern forming method by imprint, which is capable of forming the pattern with accurate dimension, is realized.

The foregoing embodiment relates to the case where a pattern is formed with using plasmon resonance of Ag. However, the metal layer 14 formed at the concave portions 13a of the template 13 is not limited to the Ag layer. That is, plasmon resonance is determined by metal and refractive index of light curable resin filling a surrounding of the metal. If the refractive index of light curable resin is 1.46 to 2.7, the relationship between metal material capable of exciting plasmon resonance and wavelength of incident light is as follows.

Ag: wavelength 365 nm to 450 nm
Pt: wavelength 365 nm to 490 nm
Cu: wavelength 460 nm to 550 nm
Au: wavelength 510 nm to 550 nm
Cr: light containing wavelength 450 nm Moreover, the metal layer 14 is not limited to a single metal, for example, Ag, Pt, Cu, Cr or metals containing those may be used as the metal layer 14.

According to the present embodiment, the light amplitude in the vicinity of the surface of the metal layer 14 of the template is increased by forming the metal layer 14 on the concave portions 13a of the template 13 and irradiating the template 13 with plasmon resonance light. This serves to remarkably improve contrast (the difference between a portion having strong light amplitude and a portion having weak light amplitude), and exposure latitude required to obtain a desired pattern dimension is remarkably improved. Therefore, it is possible to form a fine pattern having a pitch twice the template pattern.

Furthermore, the use of plasmon resonance suppresses influence of the error of amplitude of incident light to the template or the error of irradiation time, and hence a fine pattern having accurate dimensions can be formed.

FIG. 6 to FIG. 9 show an example of fabrication process applicable to the template of the embodiment. In FIG. 6 to FIG. 9, the same numbers are used to designate to the same portions as FIG. 1.

As shown in FIG. 6, first, for example, Ag is formed as a metal layer 14-1 on a quartz substrate 13-1 by deposition or sputtering. An EB (electron beam) resist 21-1 is applied on the metal layer 14-1.

Figure 7:
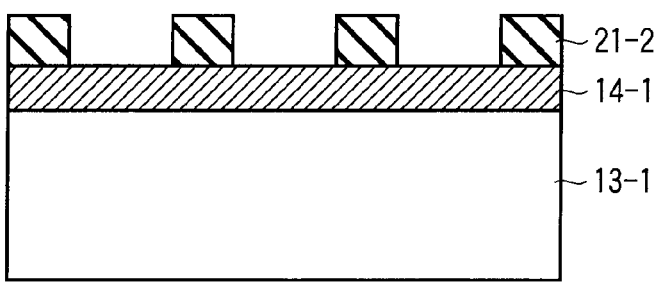
FIG. 7 is a cross-sectional view showing the fabrication process following FIG. 6.
Figure 8:
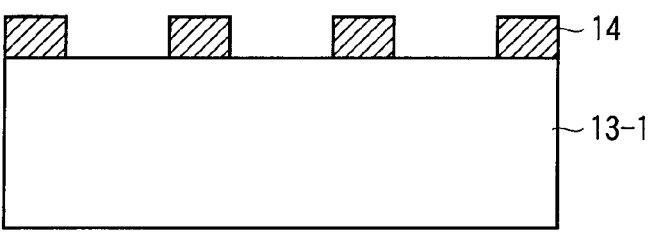
FIG. 8 is a cross-sectional view showing the fabrication process following FIG. 7.

Thereafter, as illustrated in FIG. 7, the resist 21-1 is patterned by EB drawing, and a resist pattern 21-2 is formed. The metal layer 14-1 is etched by using the resist pattern 21-2 as a mask, and as shown in FIG. 8, a pattern of the metal layer 14 is formed. The pattern formation of the metal layer 14 is not limited to EB drawing, for example, FIB (focused ion beam) drawing may be used for the pattern formation.

Next, the quartz substrate 13-1 is subjected to etching process using the metal layer 14 as a mask, in which the etching process is performed by using solution such as HF and BHF for instance.

Figure 9:
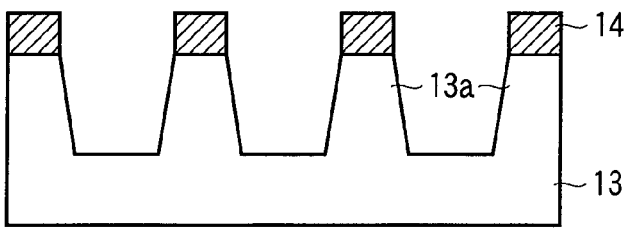
FIG. 9 is a cross-sectional view showing the fabrication process following FIG. 8.

As a result, as shown in FIG. 9, the template 13 including the metal layer 14 on the tip of concave portions 13a is completed.

The foregoing embodiment relates to the case where the quartz substrate 13-1 is etched by using the metal layers 14 as a mask, and the template 13 including the metal layers 14 on the tip of concave portions 13a is formed. However, it is not limited to the above case, for example, the metal layers 14 may be once removed, and then, the metal layers may be formed again by sputtering or vapor deposition wherein the metal layers are formed on both of top surfaces of concave portions 13a and bottom surfaces of convex portions of the concave-convex pattern formed in the template 13.

Moreover, if the metal layer having a spherical shape is formed, the amplitude of localized plasmon is enhanced.

FIG. 10 to FIG. 12 shows a fabrication process of a template including spherical metal.

As shown in FIG. 10, for example, a pattern 31 of metal is formed on a quartz substrate 13-1 The forming step of the pattern 31 is performed, for example, according as the steps of FIG. 6 to FIG. 8. The metal constituting the pattern 31 is, for example, Cr (chromium), which is used as mask material. Thereafter, spherical metal fine particles 32 are applied in a manner that the particles 32 are disposed in the metal patterns 31. The material of the metal fine particles 32 is Ag, for example. The metal fine particles 32 may be arrayed by using self-assembled. For example, a self-assembled technique such as a block copolymer may be used as the self-assembled.

Thereafter, as illustrated in FIG. 11, the metal pattern 31 is removed.

Next, the quartz substrate 13-1 is etched by using the fine metal particles 32 as a mask, and the template 13 including fine metal particles 32 on the tip of concave portions 13a is formed. The material of the fine metal particles 32 is not limited to Ag, but Pt, Cu, Cr or metal containing those may be used.

As described above, the template 13 including fine metal particles 32 at the tip of the concave portions 13a is capable of effectively improving the amplitude of localized plasmon, hence the template 13 is much more effective to the fine pattern formation.

By the way, it is advisable to control the thickness of the light curable resin described in FIG. 1 by technique such as spin coater or inkjet. For example, in a case of 50 nm roughness of substrate surface, if the thickness of the light curable resin is 50 nm or less, it is impossible to perform a patterning of the entire substrate surface by the light curable resin.

Figure 13:
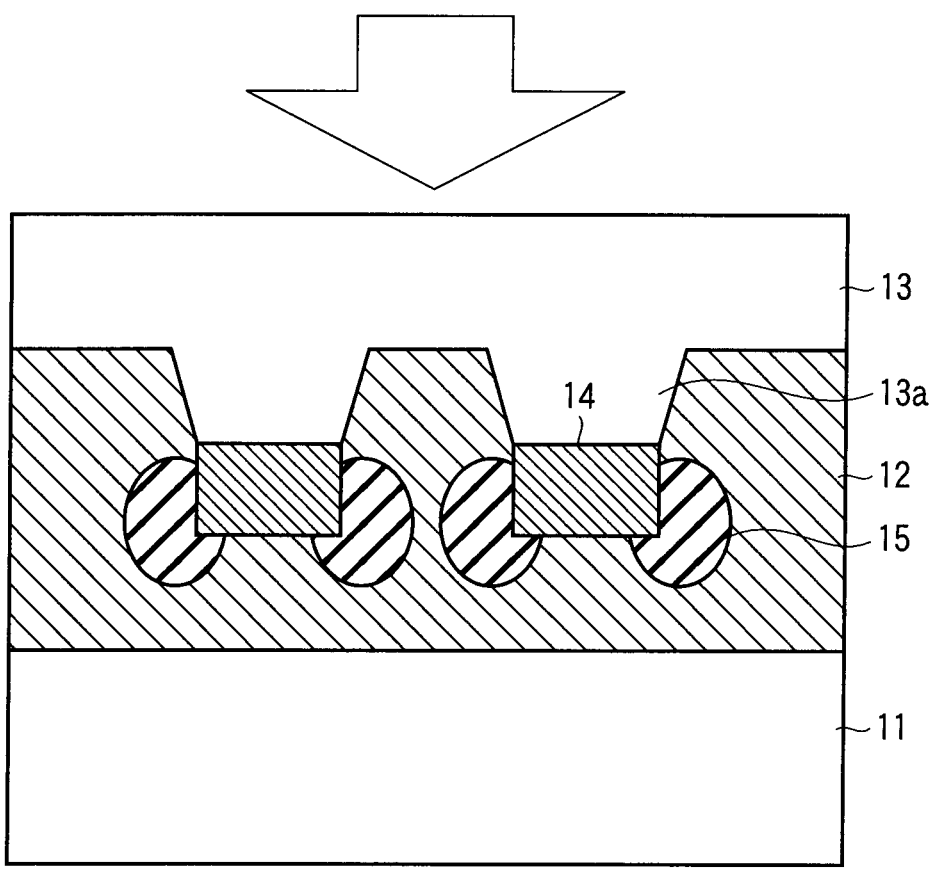
FIG. 13 is a cross-sectional view to explain another pattern forming method in accordance with one embodiment.

On the contrary, as shown in FIG. 13, if the thickness of the light curable resin is sufficiently thicker than the height of the concave portions of the template (e.g., 1 μm or more), the light curable resin 12 in the vicinity of the template 13, for example, the light curable resin 12 in a region within several tens of nm from the metal layer 14 of the concave portion 13a, is cured in near-filed region 15 where the amplitude is enhanced by plasmon resonance. However, a portion of the light curable resin 12, which is away from the template 13 and contacts the surface of the substrate 11, is hard to be cured. Therefore, the peel of pattern or the broken of pattern occurs at the time of template de-molding.

The above problem can be solved by following way.

That is, the near-field region 15 correlating with the thickness of the metal layer 14 of the template 13 (in general, the point where the amplitude of exponential function is reduced down to $1/e^2$ of the original amplitude) is set thicker than the roughness $\Delta$ of substrate. The extent of curable range in near-filed region 15 is controlled by amplitude of irradiation light or irradiation time. The roughness $\Delta$ of substrate may be measured by, for example, AFM (atomic force microscope).

In the above embodiment, the sectional shape of the concave portions of the template has a rectangle. The shape may be properly changed depending on a pattern of devices to be formed (device pattern). Moreover, the pattern forming method of the present embodiment is applicable to various components other than a semiconductor device such as a MOS transistor. For example, the pattern forming method of the present embodiment is applicable to a microlens array used for CCD that is one of optical devices, or a pattern to be formed on a wafer constituting DNA chip (bio-products).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
   contacting a template with light curable resin on a substrate, the template comprising a concave-convex pattern including concave portions and convex portions, and a metal layer provided on a convex portion of the concave-convex pattern, the concave-convex pattern being to be contacted with the light curable resin; and
   irradiating the light curable resin with light of a predetermined wavelength via the template under a condition $\epsilon_1 = -2\epsilon_2$,
   where $\epsilon_1$ is a complex relative permittivity of the metal layer corresponding to the predetermined wavelength, $\epsilon_2$ is a complex relative permittivity of the light curable resin corresponding to the predetermined wavelength.

2. The method according to claim 1, wherein the light of the predetermined wavelength has plane polarization in which main electric vector oscillates in a direction perpendicular to the concave-convex pattern.

3. The method according to claim 1, wherein the predetermined wavelength is, 365-490 nm when material of the metal layer is platinum, 460-550 nm when the material of the metal layer is copper, 510-550 nm when the material of the metal layer is gold, 450 nm when the material of the metal layer is chromium.

4. The method according to claim 1, further comprising separating the template from the light curable resin, and etching the substrate by using the template as a mask after the irradiating the light curable resin with the light via the template.

5. The method according to claim 4, wherein the substrate comprises a conductive film as an uppermost layer, and the conductive film is processed into an electrode pattern or interconnection pattern is formed by the etching.

6. The method according to claim 4, wherein the substrate comprises an insulating film as an uppermost layer, and the insulating film is processed into an contact hole pattern or a gate insulating film is formed by the etching.

7. The method according to claim 4, wherein the substrate comprises a semiconductor substrate as a main body, and an isolation region in the semiconductor substrate is formed by the etching.

8. The method according to claim 1, wherein the irradiating the light curable resin with light of the predetermined wavelength via the template generates plasmon resonance which enhances amplitude of near-field around the metal layer.

9. The method according to claim 8, wherein the near-field is correlated with thickness of the metal layer, and the thickness of the metal layer is set such that the near-field is to be thicker than roughness of a surface of the substrate.

10. The method according to claim 1, wherein the metal layer has a spherical shape.

* * * * *